United States Patent [19]
Mazzochette

[11] Patent Number: 6,049,262
[45] Date of Patent: Apr. 11, 2000

[54] SURFACE MOUNTABLE TRANSMISSION LINE DEVICE

[75] Inventor: Joseph B. Mazzochette, Cherry Hill, N.J.

[73] Assignee: EMC Technology LLC, Cherry Hill, N.J.

[21] Appl. No.: 08/924,073

[22] Filed: Aug. 28, 1997

[51] Int. Cl.$^7$ ...................................................... H01P 3/08
[52] U.S. Cl. ............................................ 333/238; 333/246
[58] Field of Search ................................. 333/238, 246, 333/161

[56] References Cited

U.S. PATENT DOCUMENTS

| | | | |
|---|---|---|---|
| 4,641,114 | 2/1987 | Person ....................................... | 333/161 |
| 4,821,007 | 4/1989 | Fields et al. ............................... | 333/238 |
| 4,916,417 | 4/1990 | Ishikawa et al. ..................... | 333/238 X |
| 5,164,692 | 11/1992 | Gertel et al. .......................... | 333/161 X |
| 5,187,455 | 2/1993 | Mandai et al. ........................... | 333/161 |
| 5,365,203 | 11/1994 | Nakamura et al. ...................... | 333/161 |

FOREIGN PATENT DOCUMENTS

| | | | |
|---|---|---|---|
| 305208 | 12/1990 | Japan ...................................... | 333/185 |

*Primary Examiner*—Benny Lee
*Attorney, Agent, or Firm*—Donald S. Cohen

[57] ABSTRACT

A transmission line device includes at least two rectangular plates of an insulating material having opposed planar surfaces and edges. A transmission line of a conductive material is on a surface of at least one of the plates and extends between two opposed edges of the plates. The plate having a transmission line thereon has holes therethrough adjacent its opposed edges, which holes extend to the ends of the transmission line. The holes are filled with a conductive material which makes electrical contact to the ends of the holes. Ground planes of a conductive material are on a surface of the plates. The plates are stacked together with the surface having the transmission lines facing a surface of another plate, and the ground planes facing outwardly. The plates are mechanically secured together either by metal clips or by a suitable cement between the opposed surfaces of the plates. Terminals are at the edges of the plates and are connected to the ends of the transmission line and to the ground planes. The terminals may be the clips which secure the plates together, or may be conductive strips along the edges of the plates. The terminals are such that the device can be surface mounted on a printed circuit board with the terminals being seated on and electrically connected to conductors on the printed circuit board.

19 Claims, 5 Drawing Sheets

6,049,262

SURFACE MOUNTABLE TRANSMISSION LINE DEVICE

FIELD OF THE INVENTION

The present invention relates to a construction of a surface mountable transmission line device, and, more particularly to such a device which is compact and relatively inexpensive.

BACKGROUND OF THE INVENTION

There are various transmission line devices for use at RF and microwave frequencies. One such device is a signal transformer which changes the impedance and the phase of a signal which provides the necessary signal inversion needed for high efficiency push-pull amplifiers, mixers, dividers and other signal processing devices. The signal inversion is commonly referred to as a transformation of the signal from balanced to unbalanced or BALUN. A BALUN generally includes a single transmission line extending between and electrically insulated from a pair of ground planes. Another type of transmission line device is a hybrid coupler. A hybrid coupler generally includes a pair of transmission lines insulated from each other and extending between and electrically insulated from a pair of ground planes. Although all of the various transmission line devices must be constructed to have the desired electrical characteristics, it is desirable that these devices be relatively simple in design and construction, and relatively inexpensive. However, the low cost of such devices not only includes the cost of making the device, but also the cost of preparation and installation of the device in the next higher assembly. One technique for lowering the cost of installation is to be able to surface mount the device on a printed circuit board. Therefore, it is desirable to have transmission line devices which are capable of being surface mounted.

SUMMARY OF THE INVENTION

A transmission line device includes a pair of plates of an insulating material having opposed planar inner and outer surface and edges. The plates are mounted on each other with the inner surfaces of the plates facing each other. A transmission line of a conductive material and having a pair of ends is on the inner surface of one of the plates. A ground plane layer of a conductive material is on the outer surface of each of the plates. Means are provided to mechanically secure the plates together. Separate means at an edge of the plates is electrically connected to each end of the transmission line and provides terminals for the transmission line. Means at an edge of the plates electrically connects the ground planes together and provides a terminal for the ground planes. The terminal means being capable of being seated on a printed circuit board and electrically connected to conductors on the board.

Another form of the transmission line device includes three plates of an insulating material having opposed planar surfaces and edges. One of the plates is mounted between the other two plates and has each of its opposed surfaces facing a surface of a separate one of the other plates. There is a separate transmission line on one of each of the opposed surfaces of the plates and a ground plane layer on the outer surface of each of the other two plates. Terminal means are at the edges of the plates and are connected to the ends of the transmission lines and terminal means are at the edges of the plates and are connected to the ground planes. Each of the terminal means is adapted to be able to be surface mounted on a printed circuit board.

BRIEF DESCRIPTION OF THE DRAWINGS

In the Figures of the drawings, identical reference numbers in different figures refer to the same element and such identical reference numbers may not be described in detail for all figures in which they appear.

DETAILED DESCRIPTION OF PREFERRED EMBODIMENTS

Figure 1:
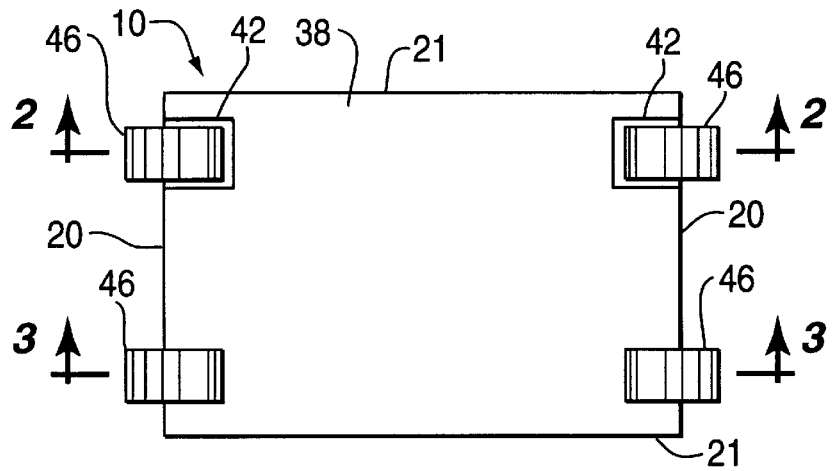
FIG. 1 is a top view of one form of a transmission line device of the present invention.
Figure 2:
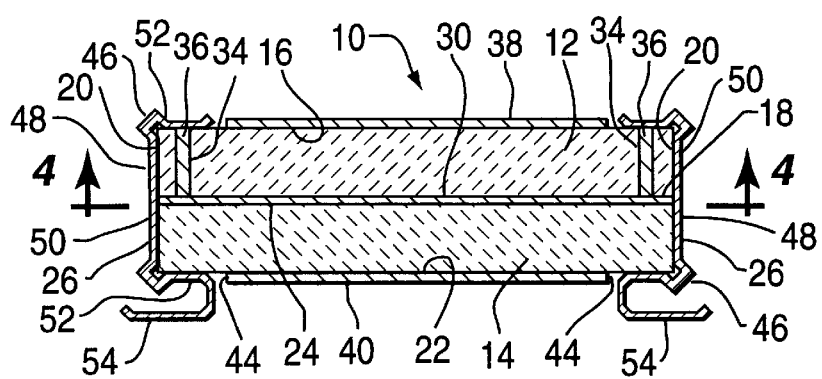
FIG. 2 is a sectional view taken along line 2—2 of FIG. 1.
Figure 3:
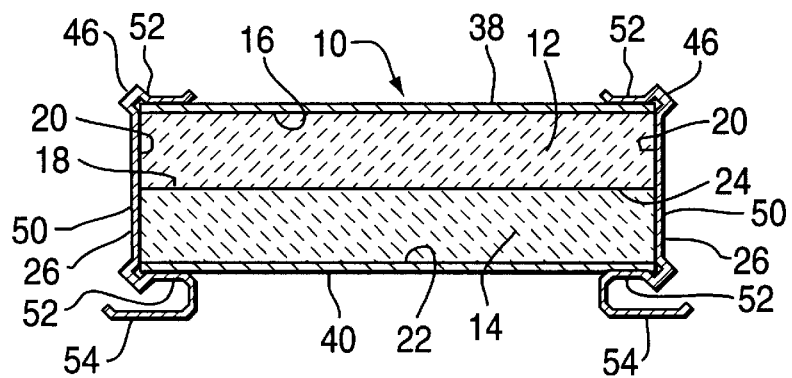
FIG. 3 is a sectional view taken along line 3—3 of FIG. 1.

Referring initially to FIGS. 1–4, one form of a transmission line device of the present invention is generally designated as 10. Transmission line device 10 is a BALUN and comprises a pair of plates 12 and 14 of an insulating material, such as a plastic or a ceramic (see FIGS. 2 and 3). As shown in FIG. 1, plate 12 is rectangular and has substantially planar outer and inner opposed surfaces 16 and 18 (See FIGS. 2 and 3), a first set of opposed parallel edges 20, and a second set of opposed parallel edges 21 which are substantially perpendicular to the first set of edges 20. Plate 14 is also rectangular and as shown in FIGS. 2 and 3 has substantially planar outer and inner opposed surface 22 and 24, a first set of opposed parallel edges 26, and a second set of opposed parallel edges (not shown) substantially perpendicular to the first set of edges 26

Figure 4:
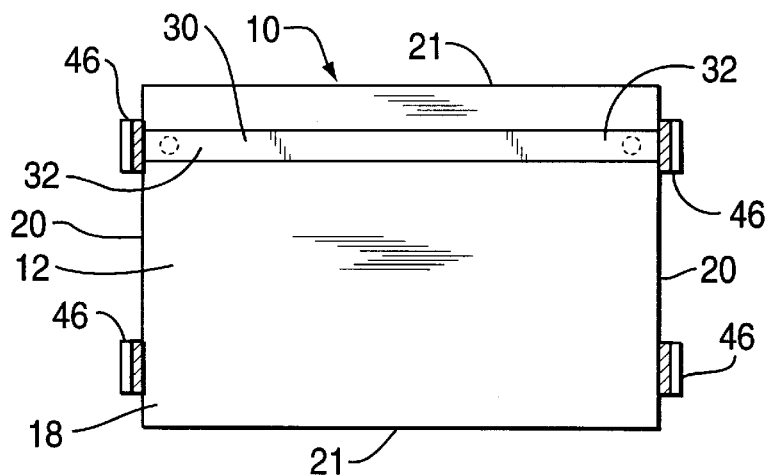
FIG. 4 is a sectional view taken along line 4—4 of FIG. 2.

As shown in FIG. 4, a transmission line strip 30 of a conductive material, such as a metal, is on the inner surface 18 of the plate 12. The transmission line strip 30 extends between and has ends 32 at the edges 20 of the plate 12. The transmission line strip 30 is adjacent and substantially parallel to one of the edges 21 of the plate 12. As shown in FIG. 2, a pair of holes 34 extend through the plate 12 between its outer and inner surfaces 16 and 18. The holes 34 are adjacent the first set of edges 20 of the plate 12 and extend to the ends 32 of the transmission line strip 30. The holes 34 are filled with a conductive material 36, such as a metal, which makes contact to the ends 32 of the transmission line strip 32. A first ground plane 38 is on the outer surface 16 of the plate 12, and a second ground plane 40 is on the outer surface 20 of the plate 14. The ground planes 38 and 40 are layers of a conductive material, such as a metal, and cover substantially the entire area of their respective surfaces 16 and 20. However, as shown in FIG. 1, the first ground plane 38 has a pair of recesses 42 therein extending from the first set of edges 20 and around the holes 34. The second ground plane 40 has similar recesses 44 therein (See FIG. 2). The plates 12 and 14 are mounted one on the other with the inner surfaces 18 and 22 of the plates 12 and 14 opposed to and contacting each other. The plates 12 and 14 are arranged with the first and second set of edges of the plate 12 being aligned with the first and second set of edges of the plate 14 respectively.

The plates 12 and 14 are mechanically secured together by four metal clips 46. As shown in FIG. 1, the clips 46 extend along the first set of edges 20 and 26 of the plates 12 and 14 with two clips 46 being along each edge. As shown in FIGS. 2 and 3, each of the clips 46 comprises a U-shaped portion 48 having a base 50 and a pair of spaced, parallel arms 52 extending in the same direction from the base 50. A leg 54 extends from the end of one of the arms 52 back along and substantially parallel to the arm 52. Each of the clips 46 is mounted on the plates 12 and 14 with the base 50 of the U-shaped portion 48 extending along the first set of edges 20 and 26 and the arms 52 extending over the outer surfaces 16 and 20 of the plates 12 and 14. The arms 52 are spaced apart a distance slightly less than the combine thicknesses of the plates 12 and 14 so that the arms 52 grip the plates 12 and 14 tightly therebetween the secure the plates 12 and 14 together. The arms 52 of two of the clips 46 are in the recesses 42 and 44 in the ground planes 38 and 40 so as to contact the outer surfaces 16 and 22 of the plates 12 and 14 and to be electrically isolated from the ground planes 38 and 40. One of the arms 52 of each of the two clips 46 contacts the conductive material 36 in the holes 34 so that the clips 46 are electrically connected to the ends 32 of the transmission strip 30 (See FIG. 2). The arms 52 of the other two clips 46 contact the ground planes 38 and 40 so as to be electrically connected to the ground planes 38 and 40 and to electrically connect the ground plates 38 and 40 together. Thus, two of the clips 46 serve as terminals for the transmission line 30 and the other two clips 46 serve as terminals for the ground planes 38 and 40.

Thus, the transmission line device 10 forms a BALUN having a transmission line 30 with terminals, two of the clips 46 at each end thereof, between and electrically insulated from a pair of ground planes 38 and 40 having a pair of terminals, two of the clips 46. Each of the clips 46 has a leg 54 at one end thereof with all of the legs 54 being at the same side of the device 10. This permits the device 10 to be mounted on a printed circuit board with the legs 54 being seated on and contacting metal conductors on the board. The legs 54 can be soldered to the conductors on the board to mechanically secure the device 10 to the board and electrically connect the transmission line 30 and ground planes 38 and 40 to the conductors on the board. If desired, the legs 54 of the clips 46 can be coated with a layer of a solder to permit ease of soldering the legs 54 to the conductors on the board. Although the transmission line strip 30 has been described as being on the inner surface 18 of the plate 12 it can be on the inner surface 28 of the plate 14.

Figure 5:
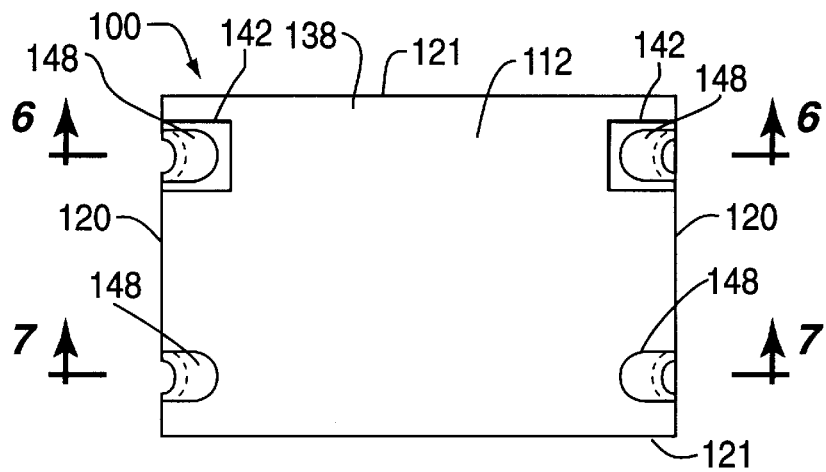
FIG. 5 is a top view of a modification of the transmission line device of the present invention shown in FIG. 1.
Figure 6:
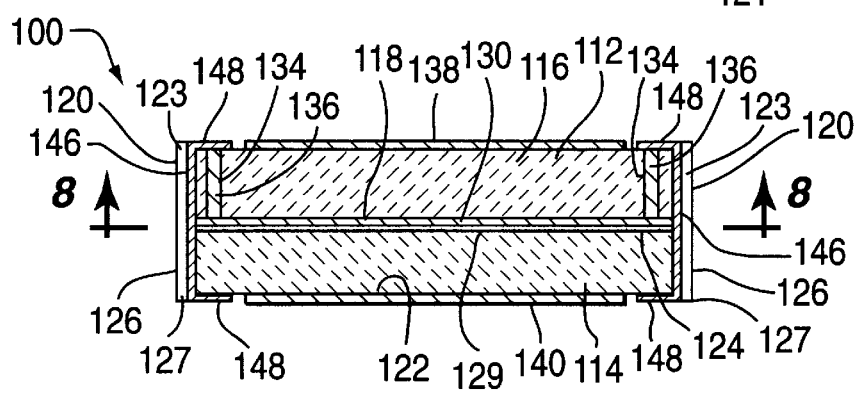
FIG. 6 is a sectional view taken along line 6—6 of FIG. 5.
Figure 7:
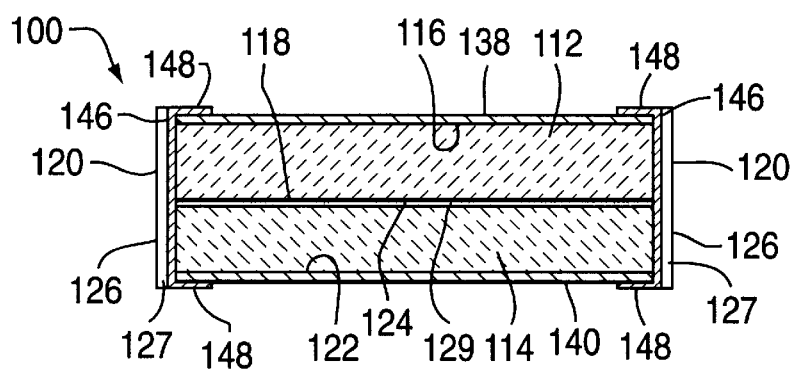
FIG. 7 is a sectional view taken along line 7—7 of FIG. 5.

Referring now to FIGS. 5–8, a modification of the transmission line device of the present invention is generally designated as 100. Transmission line device 100 is similar to the device 10 shown in FIGS. 1–4 in that, as shown in FIGS. 6 and 7 it comprises a pair of plates 112 and 114 of an insulating material. As shown in FIG. 5, plate 112 is rectangular and has substantially planar outer and inner opposed surfaces 116 and 118 (See FIGS. 6 and 7), a first set of opposed parallel edges 120, and a second set of opposed parallel edges 121 which are substantially perpendicular to the first set of edges 120. As shown in FIG. 5, plate 112 has a pair of spaced notches 123 in each of its first set of edges 120 with each notch 123 in each edge 120 being aligned with a separate notch 123 in the opposed edge 120. Plate 114 is also rectangular and, as shown in FIGS. 6 and 7 has substantially planar outer and inner opposed surfaces 122 and 124, a first set of opposed parallel edges 126 and a second set of opposed parallel edges (not shown) substantially perpendicular to the first set of edges 126. As shown in FIGS. 6 and 7, plate 114 has a pair of spaced notches 127 in each of its first set of opposed edges 126 with each notch 127 in one of the edges 126 being aligned with a separate notch 127 in the other edge 126.

Figure 8:
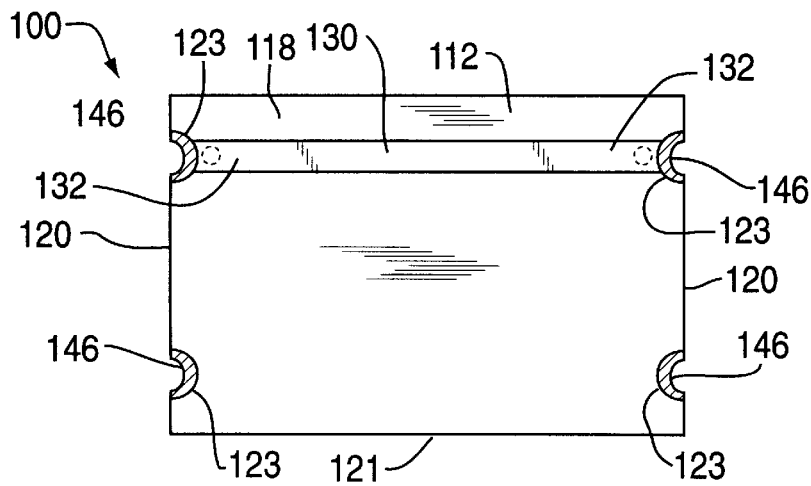
FIG. 8 is a sectional view taken along line 8—8 of FIG. 6.

As shown in FIG. 8, a transmission line strip 130 of a conductive material, such as a metal, is on the inner surface 118 of the plates 112. The transmission line strip 130 extends between the edges 120 of the plate 112 and has ends 132 each of which are at a notch 123 at a separate one of the edges 120. As shown in FIG. 6, a pair of holes 134 extend through the plate 112 between its outer and inner surfaces 116 and 118. Each of the holes 134 is adjacent but spaced slightly from a notch 123 at an edge 120 of the plate 112 at which is an end 132 of the transmission line strip 130. The holes 134 are filled with a conductive material 136, such as a metal, which makes contact to the ends 132 of the transmission line strip 130. A first ground plane 138 is on the outer surface 116 of the plates 112, and a second ground plane 140 is on the outer surface 120 of the plates 114. The ground planes 138 and 140 are layers of a conductive material, such as a metal, and cover substantially the entire area of their respective surface 116 and 120. However, the first ground plane 138 has a pair of recesses 142 therein extending from the first set of edges 120 and around the holes 134. The second ground plane 140 has similar recesses therein.

The plates 112 and 114 are mounted one on the other with the inner surfaces 118 and 122 of the plates 112 and 114 opposed to and adjacent each other. The plates 112 and 114 are arranged with the first and second set of edges of the plates 112 being aligned with the first and second set of edges of the plate 114 respectively. Also, each of the notches 123 in the plates 112 is aligned with a separate notch 127 in the plate 114. The plates 112 and 114 are mechanically secured together by a layer 129 of a suitable bonding material which is between the opposed inner surfaces 118 and 122 of the plates 112 and 114 (See FIG. 6). As shown in FIGS. 6 and 7, a layer 146 of a conductive material, such as a metal, is coated on each set of aligned notches 123 and 127. Each of the conductive layers 146 which is adjacent a recess 142 and 144 in the ground planes 138 and 140 has arms 148 which extend over the portion of the outer surfaces 116 and 122 in the recesses 142 and 144 and contacts a metal conductor 136 in a hole 134. Thus, two of the conductive layers 146 are electrically connected to the ends 132 of the transmission line strip 130 to serve as terminals for the transmission line strip 130. The other two conductive layers 146 have arms 148 which extend over and contact the ground planes 138 and 140 so as to electrically connect the ground planes 138 and 140 and serve as terminals for the ground planes 138 and 140. Thus, the transmission line device 100 forms a BALUN having a transmission line 130 with terminals, two of the conductive layers 146, at each end thereof, between and electrically insulated from a pair of ground planes 138 and 140 having a pair of terminals, two of the conductive layers 146. The device 100 can be mounted on a printed circuit board with the arms 148 at one end of the conductive layers 146 being seated on and contacting metal conductors on the board. The arms 148 can be soldered to the conductors on the board to mechanically secure the device 100 to the board and electrically connect the transmission line 130 and ground plane 138 and 140 to the conductors on the board.

Figure 9:
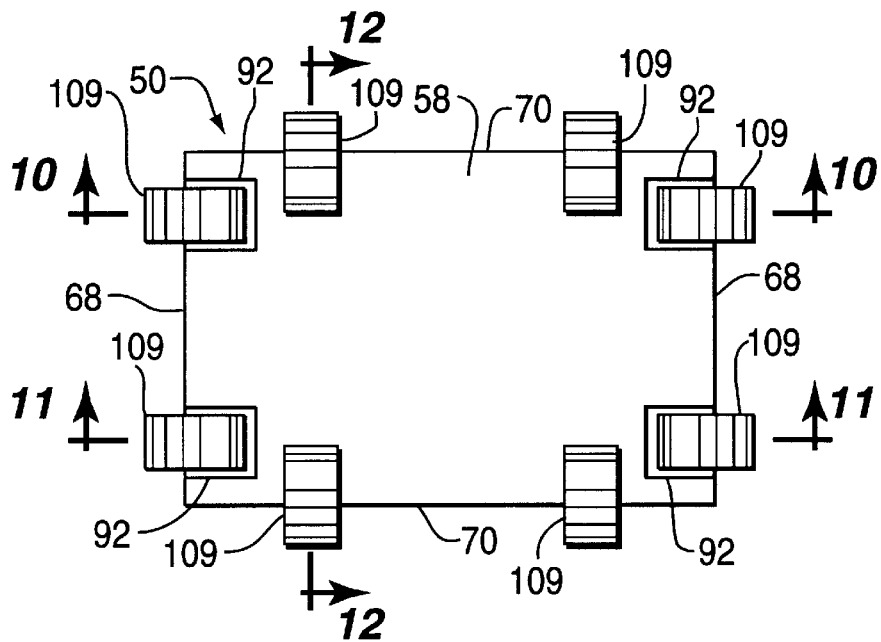
FIG. 9 is a top view of another form of the transmission line device of the present invention.
Figure 10:
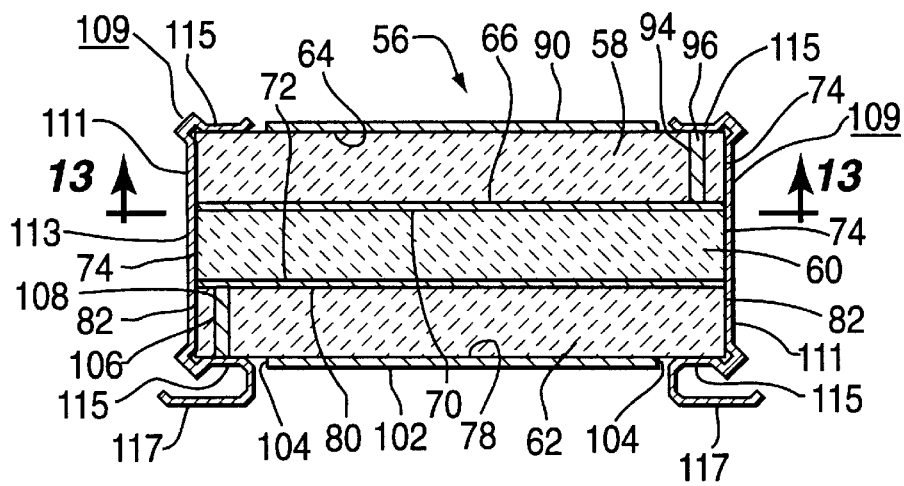
FIG. 10 is a sectional view taken along line 10—10 of FIG. 9.
Figure 11:
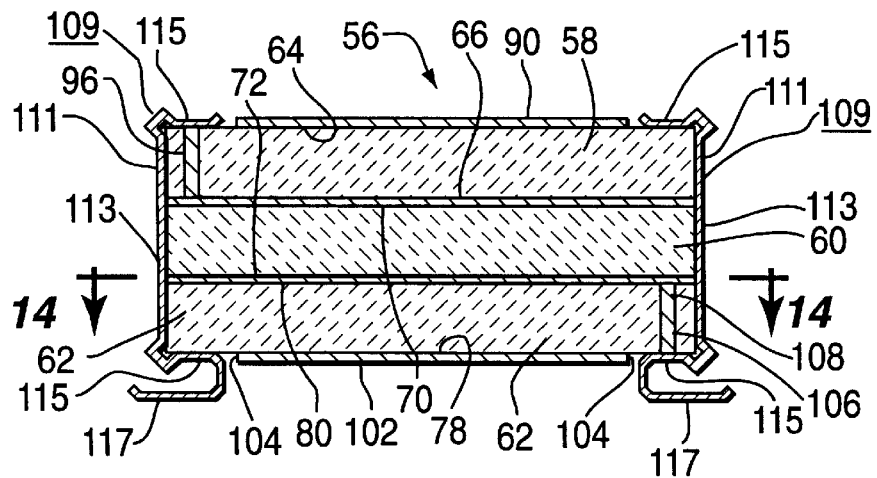
FIG. 11 is a sectional view taken along line 11—11 of FIG. 9.

Referring now to FIGS. 9–14, another form of the transmission line of the present invention is generally designated as 56. Transmission line 56 is a hybrid coupler and, as shown in FIGS. 10 and 11, comprises three rectangular plates 58, 60 and 62 of an insulating material, such as a plastic or ceramic. Plate 58 has planar outer and inner surfaces 64 and 66, a first set of parallel edges 68 and a second set of parallel edges 70 perpendicular to the first set of edges 68 (See FIG. 9). Plate 60 has a pair of planar surfaces 71 and 72, a first set of parallel edges 74 (See FIG. 10) and a second set of parallel edges 76 (See FIG. 12) perpendicular to the first set of edges 74. Plate 62 has outer and inner planar surfaces 78 and 80, a first set of parallel edges 82 (See FIG. 10) and a second set of parallel edges 84 (See FIG. 12) perpendicular to the first set of edges 82.

Figure 12:
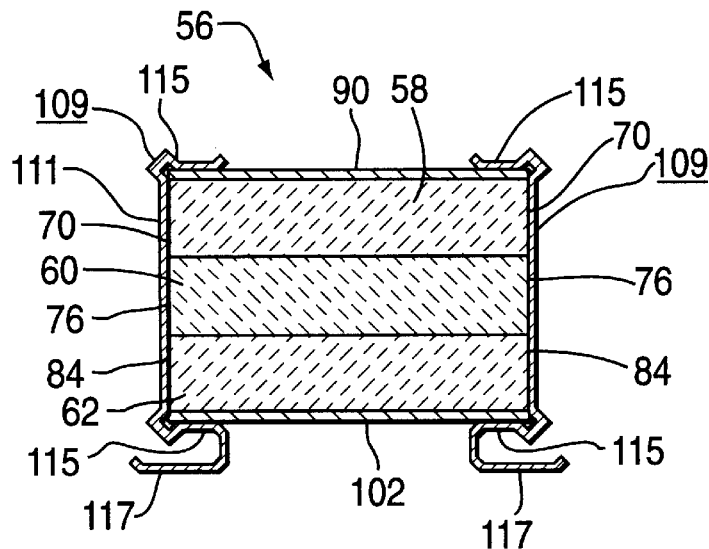
FIG. 12 is a sectional view taken along line 12—12 of FIG. 9.
Figure 13:
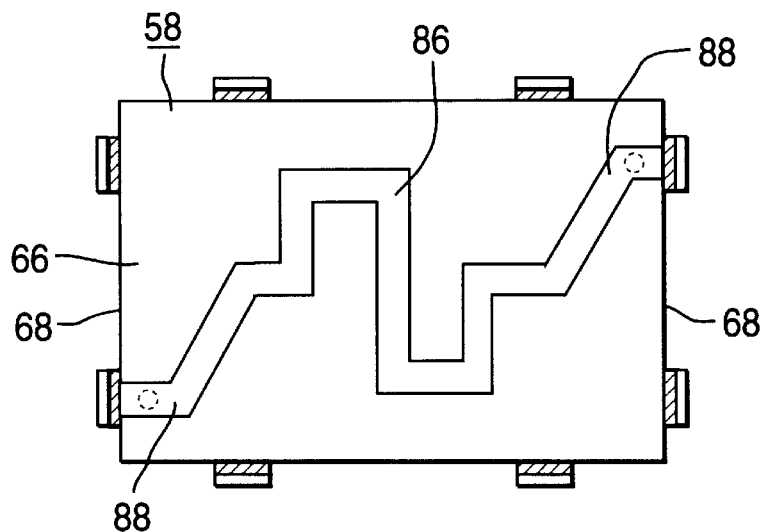
FIG. 13 is a sectional view taken along line 13—13 of FIG. 10.

As shown in FIG. 13, a first meandering transmission line 86 of a conductive material, such as a metal, is on the inner surface 66 of the plate 58 and has ends 88 which are adjacent the first set of edges 68 of the plate 58. As shown in FIGS. 10, 11 and 12, a first ground plane 90 is on the outer surface 64 of the plate 58 and extends to the edges 68 and 70 of the plate 58. As shown in FIG. 9, the ground plane 90 has a pair of recesses 92 therein at each of the first edges 68 of the plate 58. At each of the edges 68, the recesses 92 are spaced apart with one of the recesses 92 being over an end 88 of the transmission line 86. As shown in FIGS. 10 and 11, adjacent each of the first edges 68, a hole 94 extends through the plate 58 between the outer and inner surfaces 64 and 66. Each hole 94 extends to an end 88 of the first transmission line 86 and is within a recess 92 in the ground plane 90. A metal conductor 96 fills each of the holes 94 and contacts an end 88 of the transmission line 86.

Figure 14:
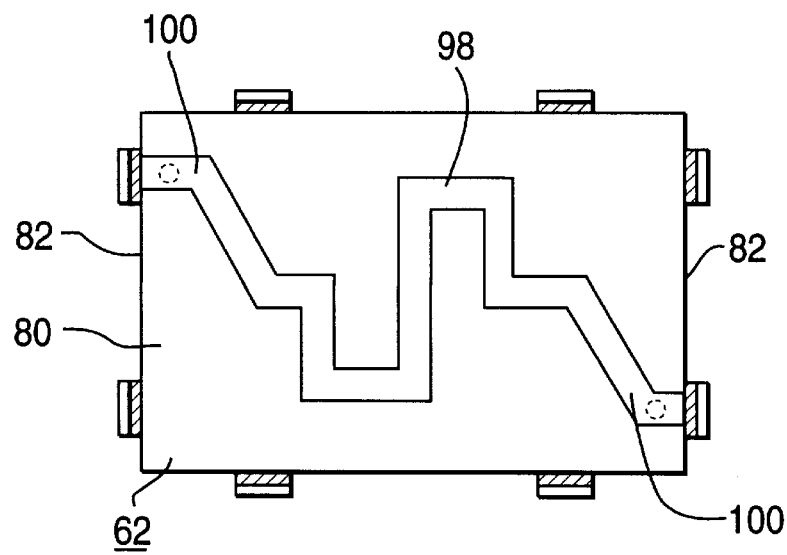
FIG. 14 is a sectional view taken along line 14—14 of FIG. 11.
Figure 15:
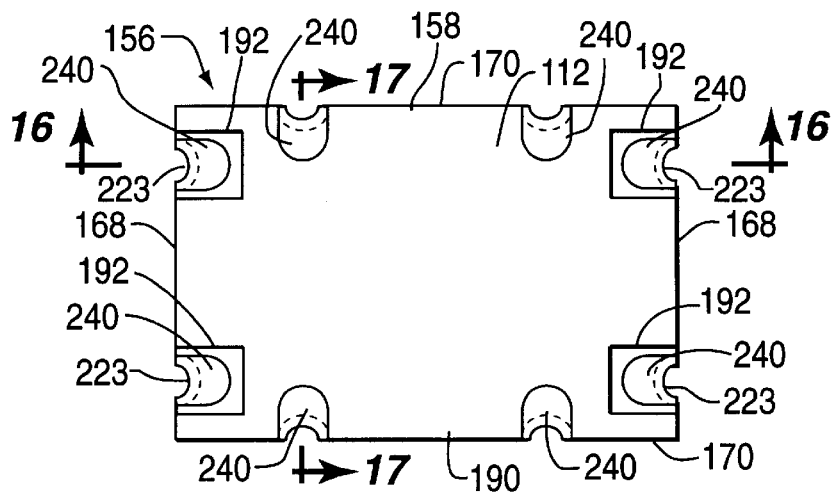
FIG. 15 is a top view of a modification of the transmission line device of the present invention shown in FIG. 9.

As shown in FIG. 14, a second meandering transmission line 98 of a conductive material, such as a metal, is on the inner surface 80 of the plate 62 and has ends 100 which are adjacent the first set of edges 82 of the plate 62. A second ground plane 102 (See FIGS. 10 and 11) of a conductive material, such as a metal, is on the outer surface 78 of the plate 62 and extends to the edges 82 and 84 of the plate 66. The second ground plane 102 has a pair of spaced recesses 104 therein at each of the first set of edges 82. One of the recesses 104 at each of the edges 82 is over an end 100 of the second transmission line 98. Adjacent each of the first edges 82, a hole 106 extends through the plate 62 between its outer and inner surfaces 78 and 80. Each hole 106 extends to an end 100 of the second transmission line 98 and is within a recess 104 in the second ground plane 102. A metal conductor 108 fills each of the holes 106 and contacts an end 100 of the second transmission line 98.

The plates 58, 60 and 62 are in stacked relation with the plate 60 being between the plates 58 and 62, and with the inner surfaces 66 and 80 of the plates 58 and 62 being opposed and in contact with a separate planar surface 71 and 72 of the plate 60. The first set of edges 66, 74 and 82 of the plates 58, 60 and 62 are in alignment, and the second set of edges 68, 76 and 84 of the plates 58, 60 and 62 are in alignment. Each of the recesses 92 in the first ground plane 90 at each of the first edges 66 of the plate 58 is in alignment with a separate recess 104 in the second ground plane 102 at each of the first edges 82 of the plate 62. Also, the first and second transmission lines 86 and 98 are arranged so that their central portions overlap but their ends 88 and 100 are spaced apart at each of the first set of edges of the plates.

The plates 58, 60 and 62 are mechanically secured together by a plurality of metal clips 109. There are two of the clips 109 at each of the first and second edges of the plates. As shown in FIGS. 10 and 11, each of the clips comprises a U-shaped portion 111 having a base 113 and a pair of spaced, parallel arms 115 extending in the same direction from the base 113. A leg 117 extends from the end of one of the arms 115 back along and substantially parallel to the arm 115. Each of the clips 109 is mounted on the plates 58, 60 and 62 with the base 113 extending along an edge of the plates 58, 60 and 62, one arm 115 extending over the outer surface 64 of the plate 58 and the other arm 115 extending over the outer surface 78 of the plate 62. The arms 15 of each clip 109 are spaced apart a distance substantially equal to the combined thicknesses of the plates 58, 60 and 62 so that they tightly grip the plates therebetween the secure the plates 58, 60 and 62 togther.

The two clips 109 which are along each of the first edges of the plates 58, 60 and 62 are spaced apart so that their arms 115 extend into the recesses 92 and 104 in the ground planes 90 and 102. One arm 115 of two of the clips 109, one at each of the first sides, contacts the conductor 96 extending through the plate 58, and one arm of the other two clips 109, one at each of the first sides, contact the conductor 108 extending through the plate 62. Thus, four of the clips 109 are electrically connected to separate ends 88 and 100 of the transmission lines 86 and 98 so as to serve as terminals for the transmission lines 86 and 98. The clips 109 along the second edges of the plates 58, 60 and 62 are spaced along the second edges and have their arms contacting the ground planes 90 and 102. Thus, these clips 109 electrically connect the ground planes 90 and 102 and serve as terminals for the ground planes 90 and 102.

Thus, the transmission line device 56 forms a hybrid coupler having a pair of transmission lines 86 and 98 insulated from each other by the plate 60 with terminals, the clips 109, at each end of each transmission line to form a four terminal device. Also, there are four terminals, the clips 109, for the ground planes 90 and 102. The clips 109 are all positioned on the plates 56, 60 and 62 with the legs 117 being on the same side of the device 56. This permits the device 56 to be mounted on a printed circuit board with the legs 117 being seated on and contacting metal conductors on the board. The legs 117 can be soldered to the conductors on the board to mechanically secure the device 56 to the board and electrically connect the transmission lines 86 and 98 and the ground planes 90 and 102 to the conductors on the board. Although the transmission lines 86 and 98 have been described as being on the inner surfaces 66 and 80 of the plates 58 and 62, they can be on the surfaces 70 and 72 of the plates 60.

Figure 16:
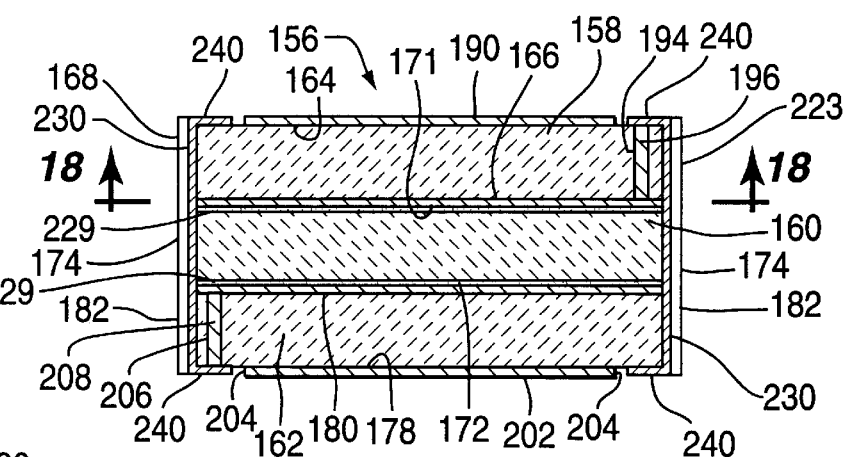
FIG. 16 is a sectional view taken along line 16—16 of FIG. 15.
Figure 17:
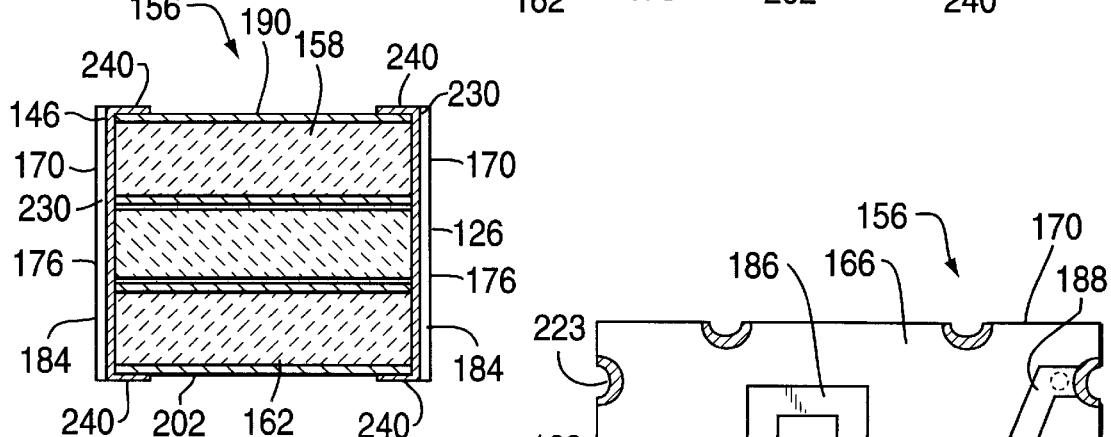
FIG. 17 is a sectional view taken along line 17—17 of FIG. 15.
Figure 18:
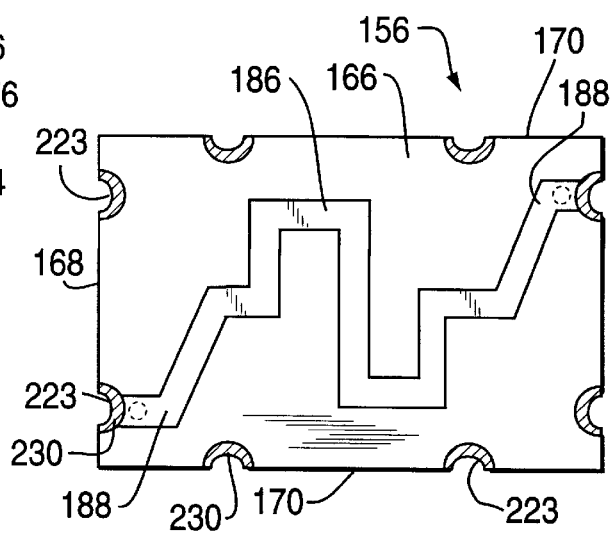
FIG. 18 is a sectional view taken along line 18—18 of FIG. 16.

Referring now to FIGS. 15–18, a modification of the transmission line device 56 of the present invention shown in FIGS. 9–14 is generally designated as 156. The transmission line device 156 is similar to the device 56 in that, as shown in FIGS. 16 and 17 it comprises three rectangular plates 158, 160 and 162. Each of the plates 158 and 162 has planar outer and inner surfaces 164, 166 and 178, 180 respectively, and two sets of edges 168, 170 and 182, 184 respectively. The plate 160 has a pair of opposed planar surfaces 171 and 172 and two sets of edges 174 and 176. Plate 158 has a first meandering transmission line 186 of a conductive material, such as a metal, on its inner surface 164 (See FIG. 18) and a first ground plane 190 of a conductive material on its outer surface 164 (See FIGS. 16 and 17). Plate 162 has a meandering transmission line (not shown but similar to the meandering transmission line 98 of the device 56) on its inner surface 180 and a second ground plane 202 on its outer surface 178 (See FIGS. 16 and 17). Each of the transmission lines extends between the edges 168 and 182 of the plates 158 and 162 and have ends adjacent such edges. The ground planes 190 and 202 each have a pair of recesses 192 and 204 respectively at the edges 168 and 182 of the plates 158 and 162 (See FIG. 16). Adjacent each of the edges 168 and 182 of the plates 158 and 162, a hole 194 and 206 extends through the plate between the inner and outer surfaces of the plates. The holes 194 and 206 extend to the ends of the transmission lines. A metal conductor 196 and 208 fills the holes 194 and 206 and each conductor 196 and 208 contacts an end of a transmission line. Each of the plates 158, 160 and 162 has a pair of spaced notches 223 in each of its edges. In the plates 158 and 162, there is a notch at each of the ends 188 and 200 of the transmission lines 186 and 198.

The plates 158, 160 and 162 are in stacked relation with the plate 160 being between the plates 158 and 162 and with the inner surfaces 166 and 180 of the plates 158 and 162 being opposed to a separate planar surface 170 and 172 of the plate 160. The edges of the plates 158, 160 and 162 are in alignment, and the notches 223 in the edges of the plates 158, 160 and 162 are in alignment. The plates 158, 160 and 162 are mechanically secured together by a layer 229 of a suitable bonding material, such as a cement or the like. A layer 230 of a conductive material, such as a metal, is coated over each of the notches 223. At two of the edges of the plates, each of the conductive layers 230 has arms 240 which extend over the outer surfaces 164 and 178 of the plates 158 and 162 and in the recesses 192 and 204 in the ground planes 190 and 202. One arm 240 of each of these conductive layers 230 contacts a metal conductors 196 and 208 so as to be electrically connected to an end of a transmission lines 186 and 198. At the other edges of the plates 158, 160 and 162, the conductive layers 230 have arms 240 which extend over and contact the ground planes 190 and 202. Thus, the conductive layers 230 at two of the edges of the plates serve as terminals for the transmission lines 186 and 198, and the conductive layers 230 at the other two edges of the plates serve as terminals for the ground planes 190 and 202. The device 156 can be mounted on a printed circuit board with the arms 240 of the conductive layers 230 being seated on a conductive strip on the board. A suitable solder can be provided between the arms 240 and the conductive strip on the board to mechanically and electrically connect the device 156 to the board.

Thus, there is provided by the present invention a transmission line device which can be formed as several types of RF transmission lines, such as a BALUN or a hybrid coupler, and which is small, compact and simple in design. Also, the device can be readily surface mounted on a printed circuit board. Thus, the device is inexpensive to both manufacture and to use.

What is claimed is:

1. A transmission line comprising:

a pair of plates of an insulating material each having respectively spaced planar outer and inner surfaces and a pair of opposed edges, the plates are mounted on each other with the inner surfaces of the plates facing each other;

a transmission line strip of a conductive material on the inner surface of at least one of the plates and having a pair of ends, said transmission line strip extending between said pair of opposed edges of the respective plate;

a ground plane of a conductive material on the outer surface of each of the plates;

a plurality of U-shaped metal clips mechanically securing the plates together, each of said clips having a base extending across the edges of the plates and arms extending over the outer surfaces of the plates so as to grip the plates therebetween;

some of said metal clips extending across the edges of the plates electrically connected to the ends of the transmission line strip and providing terminals for the transmission line strip; and some of said metal clips extending across the edges of the plates electrically connected to the ground planes on the outer surfaces of the plates and providing terminals for the ground planes.

2. The transmission line of claim 1 wherein a clip is at each of the opposed edges of the plates and is electrically connected to a separate respective end of the transmission line strip.

3. The transmission line of claim 2 wherein there is a separate clip at each of the opposed edges of the plates, each of said clips having arms thereof contacting the ground planes on each of the plates.

4. The transmission line of claim 3 wherein each of the clips has a leg extending from one end of one of the arms of the respective clip, the leg has a portion which extends parallel to and spaced from the respective arm so that it can be mounted on a printed circuit board with the respective leg being seated on and contacting a conductor on the board.

5. The transmission line of claim 2 in which there is a separate metal conductor extending through the one plate having the transmission line strip thereon adjacent each of the opposed edges of said plate with each conductor extending from the outer surface of said plate to a respective end of the transmission line strip and one arm of a clip contacts the conductor so that the clip is electrically connected to an end of the transmission line strip by the conductor.

6. The transmission line of claim 1 including a third plate of an insulating material between the opposed inner surfaces of the two plates and having opposed planar surfaces opposed to the inner surfaces of the two plates; a separate transmission line strip extends along the inner surface of each of the two plates; each of the transmission line strips has a pair of ends; the U-shaped clips which mechanically secure the two plates together also secures the two plates to the third plate; some of said metal clips electrically connected to each end of each of the transmission line strips; and some of said metal clips electrically connecting the ground planes.

7. The transmission line of claim 6 in which each of the plates has first and second sets of opposed edges, each of the transmission line strips extends between the first set of opposed edges of the plate on which the transmission line strips are on, the metal clips electrically connected to the ends of the transmission line strips are at the first set of opposed edge and the metal clips electrically connecting the ground planes are at the second set of opposed edges.

8. The transmission line of claim 7 wherein there is one clip at each of the first set of opposed edges which is electrically connected to an end of the transmission line strip on one of the plates, and a second clip at each of the first set of opposed edges which is electrically connected to an end of the transmission line strip on the other of the plates.

9. The transmission line of claim 8 in which there is a separate metal conductor extending through each of the plates adjacent each of the opposed edges of the plates with each conductor extending from the outer surface of the plate to a respective end of a transmission line strip and an arm of one of the clips contacts the conductor so that said clip is electrically connected to an end of the transmission line strip by the conductor.

10. The transmission line of claim 8 wherein there is at least one clip at each of the second set of edges, each said clip having arms thereof contacting the ground planes on each of the two plates.

11. The transmission line of claim 10 wherein each of the clips has a leg extending from one end of the one of the arms of the respective clip, the leg has a portion which extends parallel to and spaced from the respective arm so that it can be mounted on a printed circuit board with the respective leg being seated on and contacting a conductor on the board.

12. A transmission line comprising:

a pair of plates of an insulating material each having respectively spaced planar outer and inner surfaces and a pair of opposed edges, the plates are mounted on each other with the inner surface of the plates facing each other;

a transmission line strip of a conductive material on the inner surface of at least one of the plates and having a pair of ends, said transmission line strip extending between said pair of spaced edges of the respective plates;

a ground plane of a conductive material on the outer surface of each of the plates;

a layer of a bonding material between and contacting the opposed surfaces of the plates so as to mechanically secure the plates together;

a separate conductive material termination strip extending across each of the opposed edges of the plates and over a portion of each of the outer surfaces of the plates, each of the termination strips being electrically connected to a separate end of the transmission line; and means extending across the edges of the plates electrically connected to the ground planes on the outer surfaces of the plates and providing terminals for the ground planes.

13. The transmission line of claim 12 in which there is a separate metal conductor extending through the one plate having the transmission line strip thereon adjacent each of the opposed edges of the plates with the conductor extending from the outer surface of the plates to a respective end of a transmission line strip and the portion of the termination strips which extend over the outer surface of the plates contact the conductors so that each of the termination strips is electrically connected to a separate end of a transmission line strip.

14. The transmission line of claim 12 further comprising a second conductive material termination strip extending over each of said opposed edges of each of the plates and over a portion of each of the outer surfaces of the plates, the portion of the second termination strips which extend over the outer surfaces of the plates contacting the ground planes so as to electrically connect the ground planes.

15. The transmission line of claim 14 in which each of the plates has a pair of spaced notches therein extending across the opposed edges with the notches in the plates being aligned with respect to each other and the termination strips are in the notches.

16. The transmission line of claim 12, including a third plate of an insulating material between the opposed inner surfaces of the two plates; each of said plates having first and second sets of opposed edges; a separate transmission line strip extends along the inner surface of each of the two plates; each of the transmission line strips has a pair of ends; the bonding material which secures the two plates together also securing the two plates to the third plate; a separate conductive material termination strip extending across each of the opposed first set of edges of the plates and over a portion of each of the outer surfaces of the two plates, each of the termination strips being electrically connected to a separate end of a transmission line strip; and means electrically connecting the ground planes.

17. The transmission line of claim 16 in which there is a separate metal conductor extending through each of the two plates adjacent each of the first set of edges of the plates with the conductor extending from the outer surfaces of the plates to an end of the transmission line strip on the plate, and the portion of the termination strips which extend over the outer surface of the plates contacts a conductor so that each of the termination strips is electrically connected to an end of a transmission line strip.

18. The transmission line of claim 16 further comprising a second conductive material termination strip extending over each of the second set of opposed edges of the plates and over a portion of each of the outer surfaces of the two plates, the portion of the second termination strips which extend over the outer surfaces of the two plates contacting the ground planes so as to electrically connect the ground planes.

19. The transmission line of claim 18 in which each of the plates has a pair of spaced notches therein extending across each of the opposed edges with each notch in each plate being aligned with a separate notch in the other plates, and the termination strips are in the notches.

* * * * *